United States Patent [19]

Xiang et al.

[11] Patent Number: 5,363,043

[45] Date of Patent: Nov. 8, 1994

[54] PRODUCING DYNAMIC IMAGES FROM MOTION GHOSTS

[75] Inventors: Qing-San Xiang, Vancouver; Ross M. Henkelman, Toronto, both of Canada

[73] Assignee: Sunnybrook Health Science Center, Toronto, Canada

[21] Appl. No.: 15,103

[22] Filed: Feb. 9, 1993

[51] Int. Cl.$^5$ ............................................. G01R 33/20
[52] U.S. Cl. .................................................. 324/309
[58] Field of Search ............... 324/300, 307, 306, 309, 324/310, 311, 312, 313, 314, 318, 319, 322; 128/653.2, 653.5

[56] References Cited

U.S. PATENT DOCUMENTS 4,710,717 12/1987 Pelc et al. ............................ 324/309
5,162,736 11/1992 Mansfield et al. .................. 324/309

OTHER PUBLICATIONS

Kim W S, Jung K J, Lee K D, Ra J B, Cho Z H. Extaction of cardiac and respiratory motion cycles by use of projection data in NMR imaging (abstr.). In: Book of abstracts: Society of Magnetic Resonance in Medicine 1988. Berkeley, Calif: Society of Magnetic Resonance in Medicine, 1988; 958.
Pelc N J, Glover G H. Improved respiratory compensation (abstr.). In: Book of abstracts: Society of Magnetic Resonance in Medicine 1987. Berkeley, Calif: Society of Magnetic Resonance in Medicine, 1987; 776.
Hinks R S. Monitored echo gating (MEGA) for the reduction of motion artifacts (abstr.). Magn Reson Imaging 1988; 6(Suppl 1):48.
Ehman R L, Felmlee J P. Adaptive technique for high--definition MR images of moving structures. Radiology 1989; 173:255-263.
Spraggins T A. Wireless retrospective gating: Application to cine cardiac imaging. Magn Reson Imaging 1990; 8:675-681.
Runge V M, Clanton J A, James A E. Respiratory gating in magnetic resonance imaging at 0.5 Tesla. Radiology 1984; 151:521-523.
Crooks L E, Baker B, Chang H, Higgins C B. Magnetic imaging strategies for heart studies. Radiology 1984; 153:459-465.
Bailes D R, Giderdale D J, Bydder G M, Collins A G, Fermin D N. Respiratory ordering of phase encoding (ROPE): a method for reducing respiratory motion artifact in MR imaging. J Comput Assist Tomogr 1985; 9:835-838.

Primary Examiner—Michael J. Tokar
Attorney, Agent, or Firm—Robert R. Schroeder; John H. Pilarski

[57] ABSTRACT

A method for producing dynamic images from a ghosted MR image is disclosed. The method includes acquiring an image data set including a time averaged image component and a ghost component and processing these components to produce a dynamic image. A motion monitoring system is not required as in conventional cine magnetic resonance imaging.

11 Claims, 2 Drawing Sheets

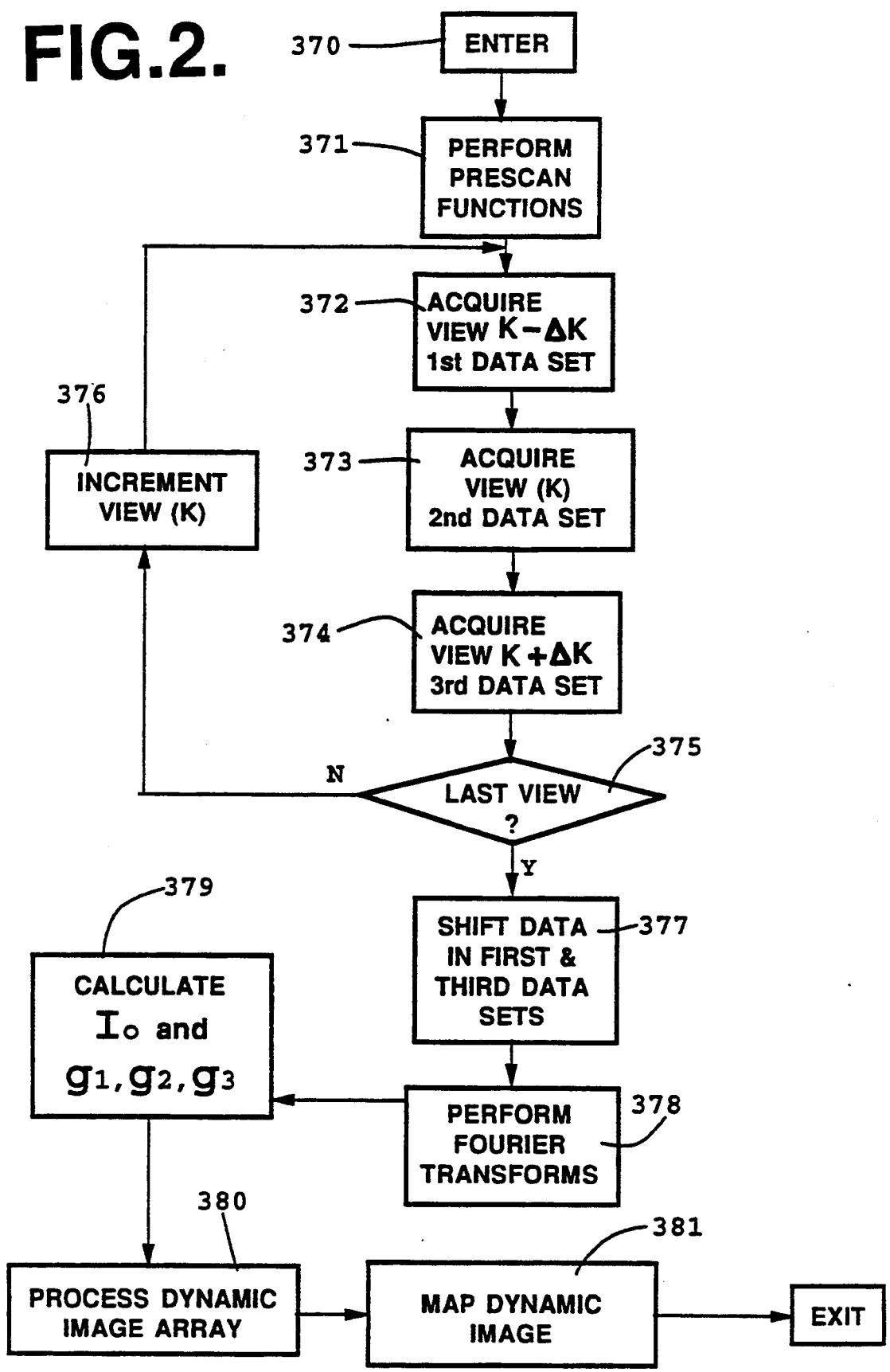

PRODUCING DYNAMIC IMAGES FROM MOTION GHOSTS

FIELD OF THE INVENTION

The invention relates to magnetic resonance imaging methods and systems. In particular, the present invention relates to a method for producing a dynamic image from motion ghosts.

BACKGROUND OF THE INVENTION

The use of MR imaging to record motion has long been of interest. Conventional techniques for collecting data for motion study required precise monitoring of the motion in addition to retrospective sorting and/or interpolating of data. This conventional cine magnetic resonance imaging required long imaging times and posed various technical difficulties.

It has now been discovered that image artifacts produced by movement of the object of interest during the acquisition of NMR data may be useful in motion imaging. These artifacts are commonly called "ghosts" and collectively comprise a ghost mask. In the image, ghosts appear as equally spaced replicas of the moving object in the phase encoding direction. Ghosts are particularly apparent when the motion is periodic, or nearly so. For most physiological motion each view of the NMR signal is acquired in a period short enough that the object may be considered stationary during the acquisition window. In such case the ghosting is due to the inconsistent appearance of the object from view to view. The primary source of such ghosts is patient motion due to respiration or the cardiac cycle.

Ghosting has been considered problematic due to the potential for diagnostic misinterpretation when the ghosts are superimposed on the anatomical image. Previously, the attempt has been made to eliminate the ghost by methods such as gated NMR scanning. Recently, however a method for cancellation of image artifacts has been developed as described in U.S. patent application Ser. No. 718,678 to Xiang et al, filed Jun. 21, 1991 and incorporated herein by reference. The method employs a decomposition procedure to separate the ghost mask from the desired image. The ghost free image obtained is the averaged spin-density distribution during the entire course of the scan.

The dynamic image reconstruction method of the present invention is based on the ghost analysis disclosed in U.S. application Ser. No. 718,678. The dynamic imaging method disclosed herein avoids the need for monitoring motion and offers a higher data acquisition efficiency than conventional cine magnetic resonance imaging.

SUMMARY OF THE INVENTION

The present invention relates to a method for producing a dynamic image of object motion. In a broad aspect of the present invention there is provided, in an MRI system for producing an image of an object which is subject to motion, a method for producing a dynamic image of the object, comprising:

acquiring a reconstructed image comprising a plurality of image pixels, each image pixel separately containing a time averaged image component $I_o$ and a ghost component g;

processing the time averaged image component $I_o$ and the ghost component g to generate a dynamic image; and, mapping the dynamic image of the object.

In a further aspect of the present invention there is provided, in an MRI system for producing an image of an object which is subject to motion, a method for producing a dynamic image of the object comprising:

acquiring a first data set comprising a plurality of data pixels, each data pixel containing a time averaged image component $I_o$ and a ghost component $g_1$;

acquiring a second data set comprising a plurality of data pixels, each data pixel containing a time averaged image component $I_o$ and a ghost component $g_2$;

acquiring a third data set comprising a plurality of data pixels, each data pixel containing a time averaged image component $I_o$ and a ghost component $g_3$;

reconstructing the acquired first, second and third data sets to produce corresponding reconstructed images $I_1$, $I_2$ and $I_3$, respectively such that the reconstructed images each comprises a plurality of image pixels, each image pixel containing the time averaged image component $I_o$ and the ghost components $g_1$, $g_2$ or $g_3$;

calculating the time averaged image component $I_o$ and the ghost components $g_1$, $g_2$ and $g_3$ for each of the plurality of image pixels of the reconstructed images;

processing the time averaged image component $I_o$ and a selected one of the ghost components $g_1$, $g_2$ or $g_3$ to generate a dynamic image; and mapping the dynamic image of the object.

BRIEF DESCRIPTION OF THE DRAWINGS

For a better understanding of the various aspects of the present invention, reference may be made by way of example to the following diagrammatic drawinqs in which:

FIG. 2 is a flow chart of a program executed to carry out the preferred embodiment of the present invention.

DESCRIPTION OF THE PREFERRED EMBODIMENT

Figure 1:
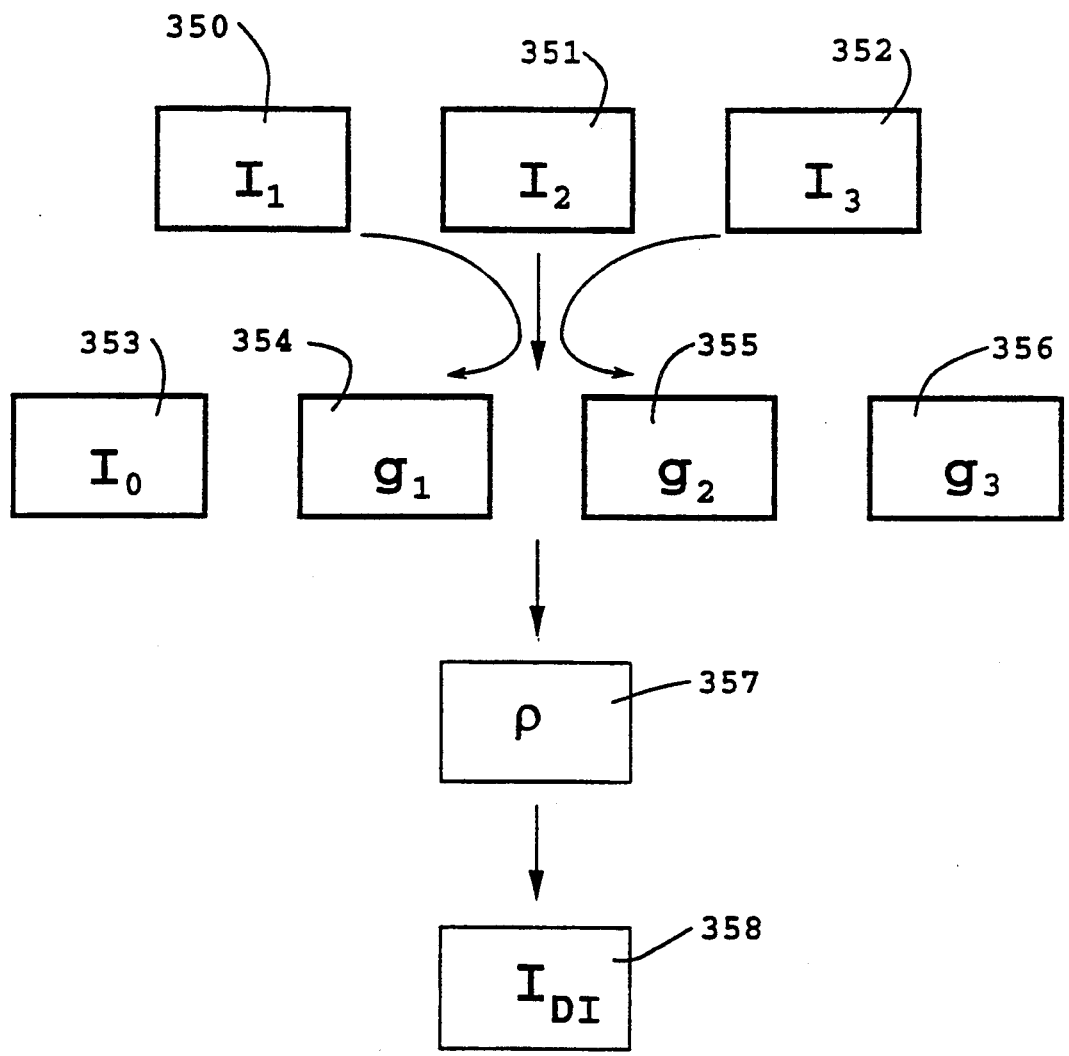
FIG. 1 is a block diagram of the data structures produced when practicing the preferred embodiment of the invention.

Periodic or quasi-periodic motion during imaging results in the degradation of the acquired MR image by the presence of image artifacts or ghosts along the phase encoded direction. The ghosts contain information about the motion and can be used to produce dynamic images of the motion. The dynamic images can then be displayed together in a cine-loop to produce a movie of the motion.

A two-dimensional Fourier transformed image having motion ghosts contains two components at each pixel The first component comprises a time averaged image component $I_o$ representing the time-averaged spin density distribution. The second component comprises the ghost g or image artifacts representing the harmonic of various orders contained in the temporal fluctuation. These ghosts g will be equally spaced along the phase encoding direction spreading out away from the image $I_o$. Since ghosts are simply the Fourier components at various frequencies contained in the time-varying spin density distribution it follows that a dynamic image can be reconstructed by summing all of the available harmonics weighted by appropriate Fourier temporal phase factors. A dynamic image represents the unblurred anatomical configuration at different times.

Referring particularly to FIG. 1, the method for practicing the present invention employs a conventional pulse sequence to acquire a plurality of MR data sets. Each data set includes 256 views, or phase encodings, and as is commonly done the data sets may be acquired in an interleaved manner as will be described in more detail below. Each of the plurality of separate MR data sets are reconstructed by performing a two-dimensional Fourier transformation on each.

In a preferred aspect of the method of the present invention as is shown in FIG. 1, three MR data sets will be acquired. The acquisition of the three data sets are such that they occur as close as possible in time and the data for each view of the second data set is acquired between the acquisitions for each view of the first and third data sets. The data sets are reconstructed by two-dimensional Fourier transformation producing three 256×256 pixel arrays of complex numbers indicated at 350, 351 and 352 encoding the three reconstructed images $I_1$, $I_2$ and $I_3$. As described in aforementioned U.S. application Ser. No. 718,678, each of these images $I_1$, $I_2$ and $I_3$ contains data which indicates the correct patient condition ($I_o$) as well as data which produces ghosts ($g_1$, $g_2$ and $g_3$). The image at each pixel in arrays 350–352 can be expressed as follows:

$$I_j = I_o + g_j, j = 1, 2 \text{ or } 3 \qquad (1)$$

In the above equation $I_j$, $I_o$ and $g_j$ are complex variables at each pixel representing the acquired reconstructed ghosted images, the time averaged image component and the ghost masks, respectively.

Furthermore, because of the manner in which the data sets are acquired, the ghost components ($g_1$, $g_2$ and $g_3$) are correlated and can be expressed by the following formula:

$$g_1 {}^* g_3 = g_2{}^2 \qquad (2)$$

This formula indicates that the ghost in the second image $I_2$ is the geometric average of the ghosts from images $I_1$ and $I_3$.

Equations (1) and (2) can be combined to solve for the ghost-free time averaged image component $I_o$:

$$I_o = \frac{I_1 * I_3 - I_2{}^2}{I_1 + I_3 - 2I_2} \qquad (3)$$

Referring to FIG. 1, this calculation is performed on the reconstructed image arrays 350–352 on a pixel-by-pixel basis ($I_1(x,y)$, $I_2(x,y)$, etc.) to produce the corresponding pixels of a 256×256 time averaged image array $I_o(x,y)$ 353. Further, equations (1) and (2) are combined to solve for the ghost components $g_1$, $g_2$, $g_3$ as follows:

$$g_1 = \frac{(I_1 - I_2)^2}{I_1 + I_3 - 2I_2} \qquad (4A)$$

$$g_2 = \frac{(I_2 - I_1)(I_3 - I_2)}{I_1 + I_3 - 2I_2} \qquad (4B)$$

$$g_3 = \frac{(I_3 - I_2)^2}{I_1 + I_3 - 2I_2} \qquad (4C)$$

Equations (4A) to (4C) are applied to the reconstructed image arrays 350–352 on a pixel-by-pixel basis to produce corresponding pixels of three 256×256 ghost image arrays $g_1(x,y)$, $g_2(x,y)$ and $g_3(x,y)$ 354, 355, 356. The pixels are complex numbers and the indicated arithmetic functions are, therefore, computations on the real and imaginary components of each array pixel.

As discussed in U.S. application Ser. No. 718,678, it should be avoided where the values of the image data $I_1$, $I_2$ and $I_3$ are such that the denominator in equation (3) is near zero. To prevent this from occurring the data acquisition should by modified to introduce significant phase twists in the ghost masks.

The displacement of a ghost from its source image is directly proportional to the temporal frequency of that specific harmonic. This relationship is expressed as:

$$d_n = n\, P_o \qquad (5)$$

where $d_n$ is the distance measured in pixels between the ghost and its source image, n is the order of the harmonic which is either a positive or negative integer and $P_o$ is the total number of cycles of motion during the entire scan time. Further, $P_o$ is related to the fundamental temporal frequency of the motion $\omega_o$ and the total scan time $T_o$ as expressed by the formula:

$$\omega_o = 2\pi P_o / T_o \qquad (6)$$

After determining $P_o$ and applying equations (5) and (6), the corrected image array $I_o$ and a ghost mask $g_j$ are then processed together to produce a dynamic image array $\rho(x,y;t)$. Processing of the dynamic image is based on the fact that, for a given pixel in an array in which the spin density is changing with time, the ghost mask records the intensities and phases of various harmonics. Further, the ghosts are located a certain distance $d_n$ away from its source image depending on the temporal frequencies of the ghost. Simply stated and referring to FIG. 1, the dynamic image array $\rho(x,y;t)$ 357 can be produced as a function of time by summing the time averaged image component $I_o$ 353 and a selected one of the ghost components $g_j$ 354–356 for each pixel. The dynamic image array is calculated as follows:

$$\rho(x, y; t) = I_o(x, y) + \sum_n g_j(x, y + d_n) \exp(i\, n\, \omega_o\, t) \qquad (7)$$

Equation (7) uses the information contained in only one ghost mask. The time dependant Fourier phase factors $\exp(i\, n\, \omega_o\, t)$ describe the temporal evolution of the harmonics. The summation index n includes various negative and positive integers corresponding to harmonics of different orders on both sides of a pixel (x,y). The dynamic image array 357 is then mapped to produce a dynamic image $I_{DI}$ 358.

Processing of the dynamic image requires that the ghost components be taken back to their source pixels. Each pixel (x,y) should be studied to be sure it is a source point before applying equation (7). This can be done by satisfying the simple expressions for each pixel as follows:

$$|I_o(x,y)| = Max\ \{|I_o(x,y)|, |g(x,y+P_o)|, |g(x,y-P_o)|\} \qquad (8)$$

$$|g(x,y)| = Min\ \{|g(x,y)|, |g(x,y+P_o)|, |g(x,y-P_o)|\} \qquad (9)$$

If both equations (8) and (9) are satisfied for given pixel (x,y), this pixel is taken as a source point for ghosts and equation (7) is then applied for that pixel.

Although three ghost masks are acquired ($g_1, g_2$ and $g_3$), only one ghost mask is needed to produce the dynamic image. The three images with ghosts were necessary however for applying equations (3) and (4A)-(4C) to separate the ghosts $g_j$ from the image $I_o$. To produce an image having improved signal to noise ratio the three ghost data sets can be averaged while considering the temporal delay $\Delta t$ of the three ghosted images.

Referring to FIG. 2, a program may be executed to perform the preferred embodiment of the present invention. The program is entered at 370 when executed a number of well known prescan functions, such as system calibrations, are performed as indicated at process block 371. A loop is then entered in which three sets of image data are acquired. The pulse sequence is executed to acquire a view of the first image data set as indicated at process block 372. The pulse sequence is repeated to acquire a view of the second image data set at process block 373, and the pulse sequence is repeated again at process block 374 to acquire a view for the third image data set. The phase encoding gradient $G_y$ is different in each of these three pulse sequences such that the view number for the first data set is a predetermined value $\Delta k$ less than the view number for the second data set, and the view number for the third data set is an equal predetermined value $\Delta k$ more than the view number for the second data set. If $k \pm k$ is out of the view range, wrap-around of the data can be applied. When all 256 views have been acquired, as determined at decision block 375, the scan is complete and image reconstructions begin. Otherwise, the view number (k) is incremented by one at block 376 and another series of three pulse sequences is performed.

As indicated at process block 377, the first step in reconstructing an image is to reorder the acquired data in the three image data sets. This is accomplished by shifting the rows of data in the first and third image data sets such that they correspond with the views acquired in each of the 256 rows of the second image data set. Then, as indicated at process block 378, a conventional two-dimensional Fourier transformation is performed on each of the three image data sets to produce the three reconstructed images $I_1$, $I_2$ and $I_3$. At process block 379, the value of each complex number in the $I_o$ array 353 is calculated by equation (3) while the value of each complex number in the ghost arrays $g_1$, $g_2$, $g_3$ are calculated using equations (4A), (4B) and (4C), respectively. At locations where the value of $I_o$ is disproportionately large due to the denominator in equation (3) approaching zero, the value is replaced with a value equal to the average of the $I_o$ values at surrounding pixels.

Finally, a dynamic image as a function of time is produced at 380 using equation (7). The dynamic image is then mapped to a CRT or to storage for later use 381. The data processing for DIR is performed in the standard complex image domain and the operations are rather simple, thus the computational load is so insignificant that only a short time interval is required for an online image reconstruction.

The method of the present invention should be used cautiously with imaging of bulky objects. Overlapping of ghosts and wrap around should be avoided by selecting appropriate imaging parameters as are appreciated by those skilled in the art.

The method of the present invention has been discussed in relation to quasi-periodic motion however the present invention is not restricted to imaging of this type of motion. Monotonic motion may be imaged by the method of the present invention provided that the k-space signal modulation appear quasi-periodic. This can be accomplished by ordering the data acquisition in a non-sequential order which causes the data to appear to be quasi-periodically modulated.

In the production of movies from the reconstructed dynamic images any number of images can be produced from a single scan. The images can be generated by using corresponding t values in equation (7). The images can then be displayed together as a series in a cine-loop for a continuously changing movie.

We claim:

1. In an MRI system wherein an object to be imaged is subject to motion, a method for producing a dynamic image of the object, comprising:

operating said system to acquire an image of the object comprising a plurality of image pixels, each image pixel having a time averaged image component $I_o$ and a ghost component g;

processing the time averaged image component $I_o$ and the ghost component g to generate a dynamic image; and mapping the dynamic image of the object to specified media.

2. The method of claim 1 wherein the dynamic image is processed as a function of time by summation of the time averaged image component $I_o$ and the ghost component g for each image pixel.

3. The method of claim 2 wherein the processing of the time averaged image component $I_o$ and the ghost component g to generate a dynamic image is accomplished according to the expression:

$$\rho(x, y; t) = I_o(x, y) + \sum_n g(x, y + d_n)\exp(i\, n\, \omega_o\, t)$$

where $\rho(x,y;t)$ is a generated dynamic image pixel, $I_o(x,y)$ is the time averaged image component of an image pixel, $g(x,y)$ is the ghost component of an image pixel, t is a time with which the spin density changes, $d_n$ is a distance between a ghost and an image source measured in pixels, n is an order of the harmonic and $\omega_o$ is a fundamental temporal frequency of the motion.

4. In an MRI system wherein an object to be imaged is subject to motion, a method for producing a dynamic image of the object comprising:

acquiring a first data set comprising a plurality of data pixels, each data pixel having a time averaged image component $I_o$ and a ghost component $g_1$;

acquiring a second data set comprising a plurality of data pixels, each data pixel having a time averaged image component $I_o$ and a ghost component $g_2$;

acquiring a third data set comprising a plurality of data pixels, each data pixel having a time averaged image component $I_o$ and a ghost component $g_3$;

reconstructing the acquired first, second and third data sets to produce corresponding reconstructed images $I_1$, $I_2$ and $I_3$, respectively such that the reconstructed images each comprises a plurality of image pixels, each image pixel containing the time averaged image component $I_o$ and the ghost components $g_1$, $g_2$ and $g_3$ for each of the plurality of image pixels of the reconstructed images;

processing the time averaged image component $I_o$ and a selected one of the ghost components $g_1$, $g_2$ and $g_3$ to generate a dynamic image; and mapping the dynamic image of the object to specified media.

5. The method of claim 4 wherein the dynamic image is processed as a function of time by summation of the time averaged image component $I_o$ and the selected one of the ghost components $g_1$, $g_2$ or $g_3$ for each image pixel.

6. The method of claim 5 wherein the processing of the time averaged image component $I_o$ and a selected one of the ghost components $g_1$, $g_2$ or $g_3$ to generate a dynamic image is accomplished according to the expression:

$$\rho(x, y; t) = I_o(x, y) + \sum_n g_j(x, y + d_n)\exp(i\, n\, \omega_o\, t)$$

where $\rho(x,y;t)$ is a generated dynamic image pixel, $I_o(x,y)$ is the time averaged image component of an image pixel, $g(x,y)$ is the ghost component of an image pixel, j is 1, 2 or 3, t is a time with which the spin density changes, $d_n$ is a distance between a ghost and an image source measured in pixels, n is an order of the harmonic and $\omega_o$ is a fundamental temporal frequency of the motion.

7. The method of claim 4 wherein the reconstructed images $I_1$, $I_2$ and $I_3$ are produced by two-dimensional Fourier transformation.

8. The method of claim 4 wherein each data set is acquired as a series of views in which a phase encoding gradient is stepped through a sequence of discrete values, and the views for the first, second and third data sets are interleaved such that each view for the second data set is acquired between the acquisition of a view for the first data set and a view for the third data set.

9. The method of claim 8 wherein the reconstructed images $I_1$, $I_2$ and $I_3$ are produced by two-dimensional Fourier transformation.

10. The method of claim 9 wherein the calculating of the time averaged image component $I_o$ for each image pixel of the reconstructed images is accomplished according to the expression:

$$I_o = (I_1 \cdot I_3 - I_2^2)/(I_1 + I_3 - 2I_2),$$

and the calculating of the ghost components $g_1$, $g_2$ and $g_3$ for each of the image pixels of the reconstructed images is accomplished according to the expressions:

$$g_1 = \frac{(I_1 - I_2)^2}{I_1 + I_3 - 2I_2}$$

$$g_2 = \frac{(I_2 - I_1)(I_3 - I_2)}{I_1 + I_3 - 2I_2}$$

$$g_3 = \frac{(I_3 - I_2)^2}{I_1 + I_3 - 2I_2}.$$

11. The method of claim 10 wherein the processing of the time averaged image component $I_o$ and a selected one of the ghost components $g_1$, $g_2$ or $g_3$ to generate a dynamic image data set is accomplished according to the expression:

$$\rho(x, y; t) = I_o(x, y) + \sum_n g_j(x, y + d_n)\exp(i\, n\, \omega_o\, t)$$

where $\rho(x,y;t)$ is a generated dynamic image pixel, $I_o(x,y)$ is the time averaged image component of an image pixel, $g(x,y)$ is the ghost component of an image pixel, j is 1, 2 or 3, t is a time with which the spin density changes, $d_n$ is a distance between a ghost and an image source measured in pixels, n is an order of the harmonic and $\omega_o$ is a fundamental temporal frequency of the motion.

* * * * *